(12) United States Patent
Zheng et al.

(10) Patent No.: US 10,665,819 B1
(45) Date of Patent: May 26, 2020

(54) MOISTURE CONVEYING LAYER, DISPLAY PANEL, DISPLAY APPARATUS, METHOD OF MANUFACTURING MOISTURE CONVEYING LAYER, AND METHOD OF MANUFACTURING DISPLAY PANEL

(71) Applicants: BEIJING BOE DISPLAY TECHNOLOGY CO., LTD., Beijing (CN); BOE TECHNOLOGY GROUP CO., LTD., Beijing (CN)

(72) Inventors: Xiaoyi Zheng, Beijing (CN); Yanqiu Li, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/514,910

(22) Filed: Jul. 17, 2019

(30) Foreign Application Priority Data

Nov. 7, 2018 (CN) .......................... 2018 1 1318593

(51) Int. Cl.
*H01L 51/52* (2006.01)
*H01L 51/56* (2006.01)
*H05B 33/04* (2006.01)

(52) U.S. Cl.
CPC .......... *H01L 51/5259* (2013.01); *H01L 51/56* (2013.01); *G09G 2330/04* (2013.01); *H05B 33/04* (2013.01)

(58) Field of Classification Search
CPC .. H01L 51/5259; H01L 51/56; H01L 2330/04
See application file for complete search history.

(56) References Cited

U.S. PATENT DOCUMENTS

| 3,585,037 A * | 6/1971 | Gallois ..................... G03F 7/06 430/263 |
| 7,585,794 B2 * | 9/2009 | Bihy ....................... B32B 33/00 442/117 |
| 8,158,259 B2 * | 4/2012 | Ramamurthy ....... G01N 33/525 428/411.1 |
| 9,054,327 B2 * | 6/2015 | Kim .................... H01L 51/5256 |

* cited by examiner

*Primary Examiner* — Ida M Soward
(74) *Attorney, Agent, or Firm* — Kinney & Lange, P.A.

(57) ABSTRACT

Embodiments of the present disclosure provide a moisture conveying layer, a display panel having the moisture conveying layer, a display apparatus having the display panel, a method of manufacturing a moisture conveying layer, and a method of manufacturing a display panel. The moisture conveying layer includes: a bottom wall; a first sidewall and a second sidewall which are disposed opposite to each other, and which, together with the bottom wall, form a moisture conveying channel; and a flow guide member located between the first sidewall and the second sidewall. The flow guide member includes a first end connected to the bottom wall, and a second end, and an angle between the flow guide member and the bottom wall is an acute angle.

20 Claims, 10 Drawing Sheets

MOISTURE CONVEYING LAYER, DISPLAY PANEL, DISPLAY APPARATUS, METHOD OF MANUFACTURING MOISTURE CONVEYING LAYER, AND METHOD OF MANUFACTURING DISPLAY PANEL

CROSS-REFERENCE TO RELATED APPLICATION

This application claims the benefit of Chinese Patent Application No. 201811318593.0, filed with the State Intellectual Property Office of China on Nov. 7, 2018, the whole disclosure of which is incorporated herein by reference.

TECHNICAL FIELD

Embodiments of the present disclosure relate to the field of display technology, and particularly to a moisture conveying layer, a display panel having the moisture conveying layer, a display apparatus having the display panel, a method of manufacturing a moisture conveying layer, and a method of manufacturing a display panel.

BACKGROUND

Most materials used in an organic light-emitting diode (OLED) are sensitive to moisture. The moisture may enter the OLED packaging or the moisture may enter the OLED since its airtightness will become poor after the OLED is used for a period of time, thereby adversely affecting service life of the OLED.

SUMMARY

Embodiments of the present disclosure provide a moisture conveying layer including: a bottom wall; a first sidewall and a second sidewall which are disposed opposite to each other, and which, together with the bottom wall, form a moisture conveying channel; and a flow guide member located between the first sidewall and the second sidewall, wherein the flow guide member includes a first end connected to the bottom wall, and a second end, and an angle between the flow guide member and the bottom wall is an acute angle.

In embodiments of the present disclosure, the moisture conveying layer further includes: a top wall which, together with the first sidewall, the second sidewall and the bottom wall, forms the moisture conveying channel, wherein there is a gap between the second end of the flow guide member and the top wall.

In embodiments of the present disclosure, the moisture conveying layer further includes: a moisture conveying layer substrate on which the bottom wall is located.

In embodiments of the present disclosure, the flow guide member has a rod shape.

In embodiments of the present disclosure, there is a gap between the flow guide member and at least one of the first sidewall and the second sidewall.

In embodiments of the present disclosure, the bottom wall has a hydrophilic surface configured to be in contact with moisture In embodiments of the present disclosure, each of the first sidewall, the second sidewall, the top wall and the flow guide member has a hydrophobic surface configured to be in contact with the moisture.

In embodiments of the present disclosure, the moisture conveying layer further includes: a hydrophilic layer, on which the first sidewall and the second sidewall are disposed, and a portion of which constitutes the bottom wall.

In embodiments of the present disclosure, the second end of the flow guide member is a pointed end includes at least one of: a pointed end; and an end surface which extends in a direction substantially perpendicular to the bottom wall.

In embodiments of the present disclosure, the moisture conveying layer includes a plurality of the flow guide members inclined towards a same direction.

In embodiments of the present disclosure, an angle between the flow guide member and a normal of the bottom wall ranges from 15 degrees to 75 degrees.

In embodiments of the present disclosure, a spacing between the top wall and the bottom wall is greater than 2 mm, and less than or equal to 5 mm, a maximal size of the flow guide member in a direction from the first sidewall to the second sidewall is in a range of 0.2 mm to 0.8 mm, and the gap between the second end of the flow guide member and the top wall is greater than 0.25 mm, and less than or equal to 0.6 mm.

In embodiments of the present disclosure, a material of the bottom wall includes any one or any combination of titanium dioxide, copper oxide, silicon dioxide, and aluminum oxide.

Embodiments of the present disclosure further provide a display panel including: an organic light-emitting diode; and the above moisture conveying layer, wherein the moisture conveying layer covers the organic light-emitting diode, and is configured to collect moisture and convey the collected moisture.

In embodiments of the present disclosure, the display panel further includes: a water absorption layer located at an end of the moisture conveying channel of the moisture conveying layer, wherein the moisture conveying layer is configured to convey the collected moisture to the water absorption layer and the water absorption layer is configured to absorb the moisture.

In embodiments of the present disclosure, a material of the water absorption layer includes an absorbent polymer.

Embodiments of the present disclosure further provide a display apparatus including the above display panel.

Embodiments of the present disclosure further provide a method of manufacturing a moisture conveying layer, the method including: forming a bottom wall; forming a first sidewall and a second sidewall which are disposed opposite to each other, and which, together with the bottom wall, form a moisture conveying channel; and forming a flow guide member located between the first sidewall and the second sidewall, wherein the flow guide member includes a first end connected to the bottom wall, and a second end, and an angle between the flow guide member and the bottom wall is an acute angle.

In embodiments of the present disclosure, the method further includes: forming a top wall which, together with the first sidewall, the second sidewall and the bottom wall, forms the moisture conveying channel, wherein there is a gap between the second end of the flow guide member and the top wall.

Embodiments of the present disclosure further provide a method of manufacturing a display panel, the method including: providing a display panel substrate; forming an organic light-emitting diode on the display panel substrate; forming a moisture conveying layer which covers the organic light-emitting diode, the moisture conveying layer including: a bottom wall; a first sidewall and a second sidewall which are disposed opposite to each other, and which, together with the bottom wall, form a moisture conveying channel; and a flow guide member located between the first sidewall and the second sidewall, wherein the flow guide member includes a first end connected to the bottom wall, and a second end, and an angle between the flow guide member and the bottom wall is an acute angle.

BRIEF DESCRIPTION OF THE DRAWINGS

The accompanying drawings described herein are used to provide further understanding of the present disclosure and constitute a part of the present disclosure. The accompanying drawings show embodiments of the present disclosure and are used to explain the principles of the present disclosure.

DETAILED DESCRIPTION

Figure 1:
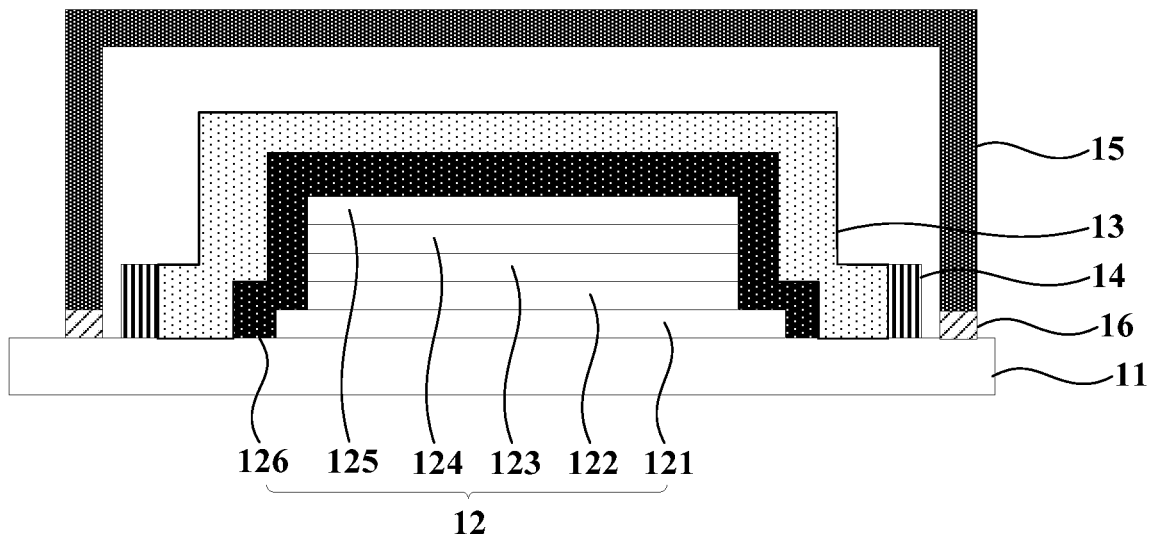
FIG. 1 is a schematic view showing a structure of a display panel according to an embodiment of the present disclosure.

Reference will now be made in detail to exemplary embodiments, examples of which are illustrated in the accompanying drawings. When the accompanying drawings are referred to in the following description, the same or similar elements are denoted by the same reference numerals in different drawings unless otherwise indicated. The exemplary embodiments described as below are not all of the embodiments of the present disclosure. In contrast, they are only some examples of devices and methods of the present disclosure.

Figure 2A:
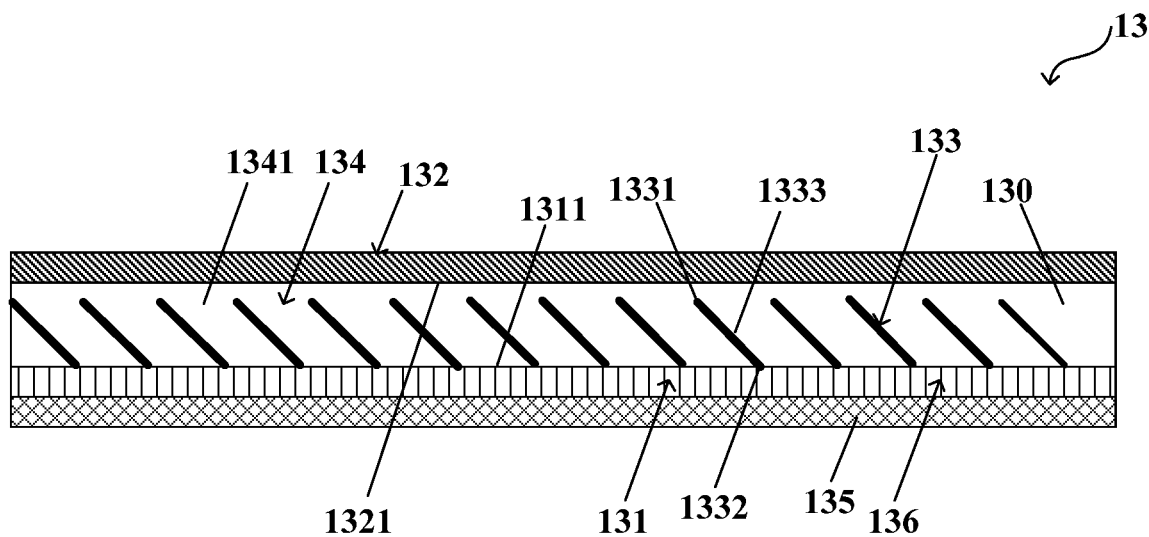
FIG. 2(A) is a schematic side view showing a structure of a moisture conveying layer according to an embodiment of the present disclosure, in which one sidewall is removed for the sake of clarity.
Figure 2B:
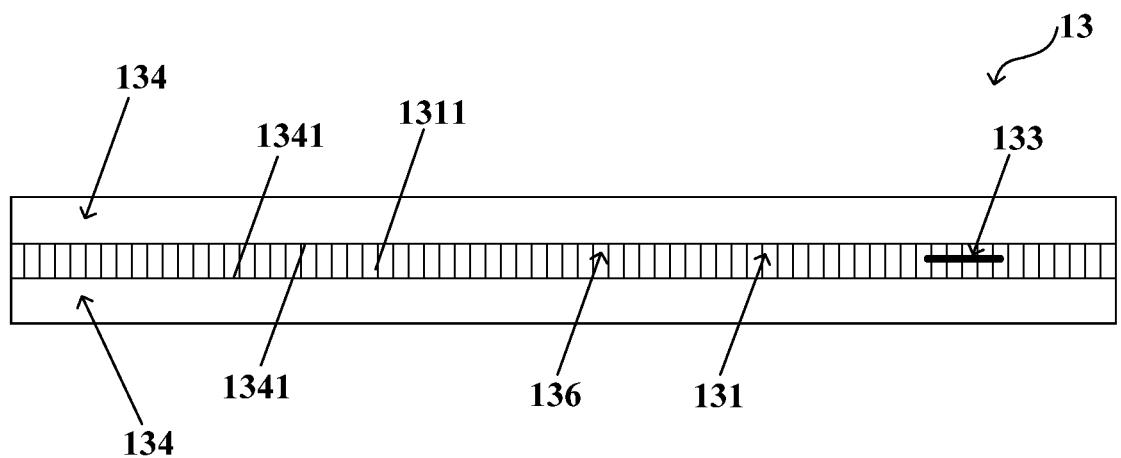
FIG. 2(B) is a schematic top view showing a structure of the moisture conveying layer according to the embodiment of the present disclosure, shown in FIG. 2(A), in which a top wall is removed and a single flow guide member is illustrated for the sake of clarity.
Figure 2C:
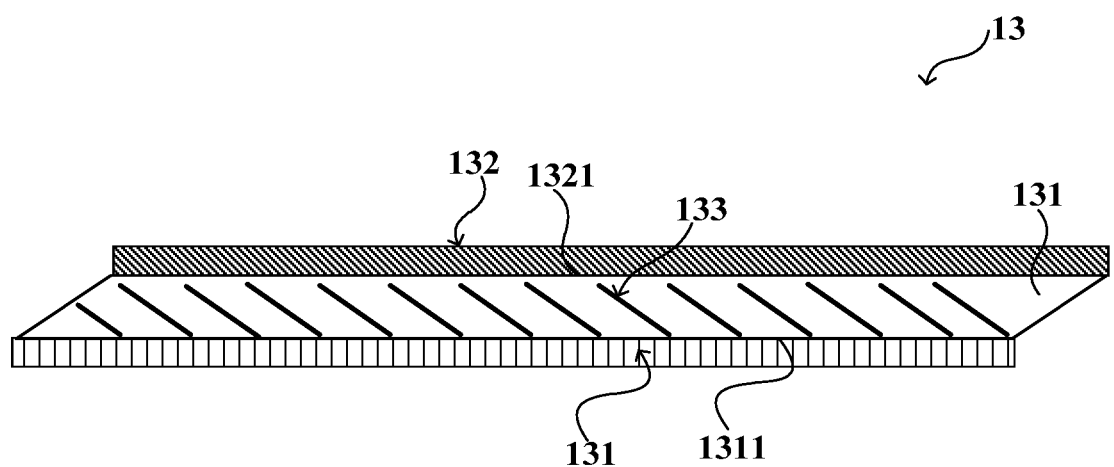
FIG. 2(C) is a schematic side view showing a structure of the moisture conveying layer according to the embodiment of the present disclosure, shown in FIG. 2(A), in which one sidewall is removed for the sake of clarity.
Figure 3:
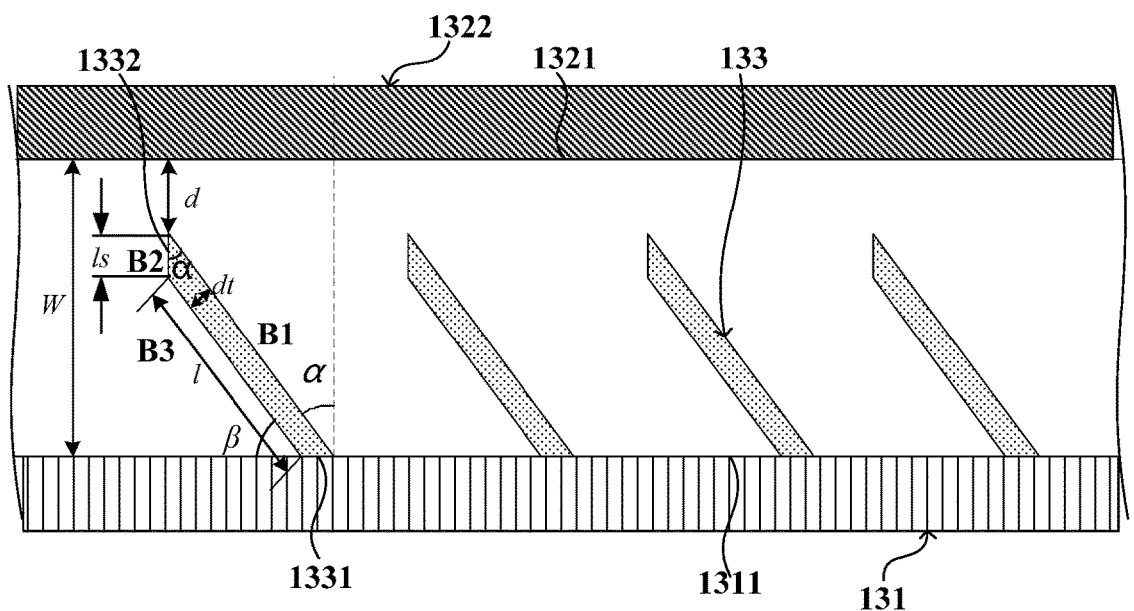
FIG. 3 is a schematic enlarged view showing a structure of a drain passage according to the embodiment of the present disclosure, shown in FIG. 2(A)

FIG. 2(A) is a schematic side view showing a structure of a moisture conveying layer 13 according to an embodiment of the present disclosure, in which one sidewall 134 is removed for the sake of clarity; FIG. 2(B) is a schematic top view showing a structure of the moisture conveying layer 13 according to the embodiment of the present disclosure, shown in FIG. 2(A), in which a top wall 132 is removed and a single flow guide member 133 is illustrated for the sake of clarity; FIG. 2(C) is a schematic side view showing a structure of the moisture conveying layer according to the embodiment of the present disclosure, shown in FIG. 2(A), in which one sidewall is removed for the sake of clarity; and FIG. 3 is a schematic enlarged view showing a structure of a drain passage according to the embodiment of the present disclosure, shown in FIG. 2(A).

Embodiments of the present disclosure provide a moisture conveying layer 13. Referring to FIGS. 2A, 2B, 2C and 3, the moisture conveying layer 13 includes: a bottom wall 131; a first sidewall 134 and a second sidewall 134 which are disposed opposite to each other, and which, together with the bottom wall 131, form a moisture conveying channel 130; and a flow guide member 133 located between the first sidewall 134 and the second sidewall 134. The flow guide member 133 includes a first end 1331 connected to the bottom wall 131, and a second end 1332, and an angle between the flow guide member 133 and the bottom wall 131 is an acute angle. The flow guide member 133 may have a rod shape. The flow guide member 133 may have a circular cross section. The second end 1332 of the flow guide member 133 may be a pointed end. For example, the second end 1332 of the flow guide member 133 has an end surface 1334 which extends in a direction substantially perpendicular to the bottom wall 131.

Referring to FIGS. 2A, 2B, 2C and 3, in embodiments of the present disclosure, the moisture conveying layer 13 further includes: a top wall 132 which, together with the first sidewall 134, the second sidewall 134 and the bottom wall 131, forms the moisture conveying channel 130. There is a gap d between the second end 1332 of the flow guide member 133 and the top wall 132. The moisture conveying layer 13 may not include the top wall 132, or the top wall 132 of the moisture conveying layer 13 is constituted by a layer of an apparatus, such as an OLED display panel, to which the moisture conveying layer 13 is applied.

Referring to FIGS. 2A, 2B, 2C and 3, in embodiments of the present disclosure, the moisture conveying layer 13 further includes: a moisture conveying layer substrate 135 on which the bottom wall 131 is located. Alternatively, the bottom wall 131 may be formed on a layer of an apparatus, such as an OLED display panel, to which the moisture conveying layer 13 is applied.

Referring to FIG. 2B, in embodiments of the present disclosure, there is a gap between the flow guide member 133 and at least one of the first sidewall 134 and the second sidewall 134. For example, there is a gap between the flow guide member 133 and each of the first sidewall 134 and the second sidewall 134.

Referring to FIGS. 2A, 2B, 2C and 3, in embodiments of the present disclosure, the bottom wall 131 has a hydrophilic surface 1311 configured to be in contact with moisture, and/or each of the first sidewall 134, the second sidewall 134, the top wall 132 and the flow guide member 133 has a hydrophobic surface configured to be in contact with the moisture. Specifically, the first sidewall 134 has a hydrophobic surface 1341 configured to be in contact with the moisture, the second sidewall 134 has a hydrophobic surface 1341 configured to be in contact with the moisture, the top wall 132 has a hydrophobic surface 1321 configured to be in contact with the moisture, and the flow guide member 133 has a hydrophobic surface 1333 configured to be in contact with the moisture.

Referring to FIGS. 2A, 2B, 2C and 3, in embodiments of the present disclosure, the moisture conveying layer 13 further includes: a hydrophilic layer 136 on which the first sidewall 134 and the second sidewall 134 are disposed, and a portion of which constitutes the bottom wall 131.

Referring to FIGS. 2A, 2B, 2C and 3, in embodiments of the present disclosure, the moisture conveying layer 13 includes a plurality of the flow guide members 133 inclined towards a same direction.

Referring to FIG. 3, in embodiments of the present disclosure, an angle between the flow guide member 133 and a normal of the bottom wall 131 ranges from 15 degrees to 75 degrees.

Referring to FIGS. 2A, 2B, 2C and 3, in embodiments of the present disclosure, a spacing W between the top wall 132 and the bottom wall 131 is greater than 2 mm, and less than or equal to 5 mm, a maximal size of the flow guide member 133 in a direction from the first sidewall 134 to the second sidewall 134 is in a range of 0.2 mm to 0.8 mm, and the gap d between the second end 1332 of the flow guide member 133 and the top wall 132 is greater than 0.25 mm, and less than or equal to 0.6 mm.

Referring to FIGS. 2A, 2B, 2C and 3, in embodiments of the present disclosure, a material of the bottom wall 131 includes any one or any combination(s) of titanium dioxide, copper oxide, silicon dioxide, and aluminum oxide. For example, a material of the hydrophilic layer 136 includes any one or any combination(s) of titanium dioxide, copper oxide, silicon dioxide, and aluminum oxide.

Figure 4:
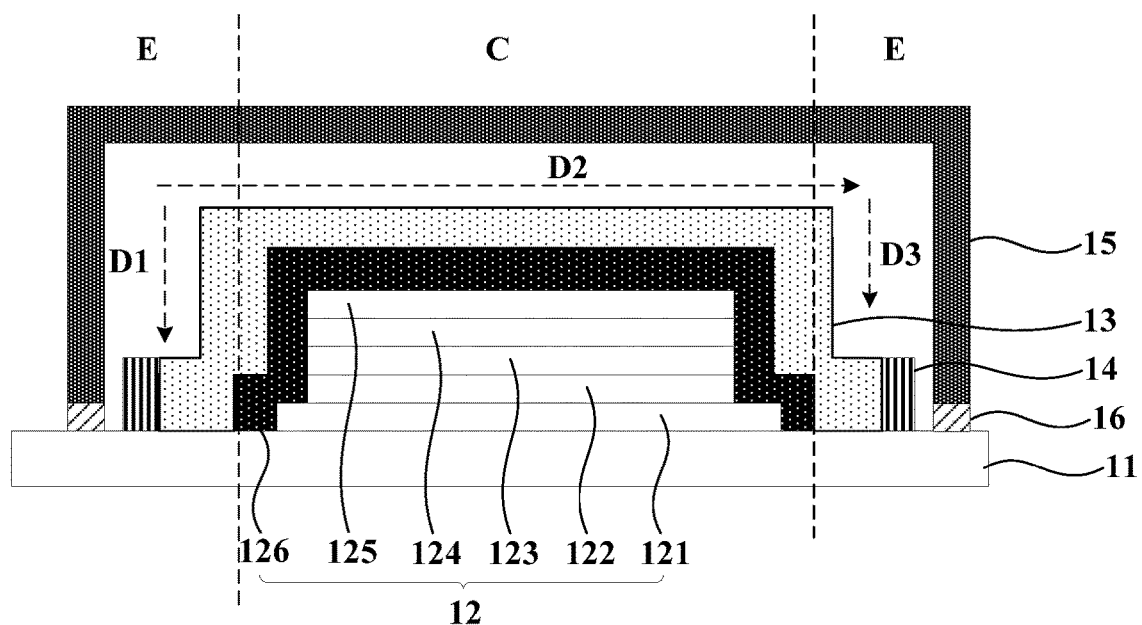
FIG. 4 is a schematic view showing a structure of a display panel according to an embodiment of the present disclosure.

Embodiments of the present disclosure further provide a display panel. Referring to FIGS. 1 and 4, the display panel includes: an organic light-emitting diode 12; and the above moisture conveying layer 13. The moisture conveying layer 13 covers the organic light-emitting diode 12 and is configured to collect a moisture and convey the collected moisture.

Referring to FIGS. 1 and 4, in embodiments of the present disclosure, the display panel further includes: a water absorption layer 14 located at an end of the moisture conveying channel 130 of the moisture conveying layer 13. The moisture conveying layer 13 is configured to convey the collected moisture to the water absorption layer 14 and the water absorption layer 14 is configured to absorb the moisture. A material of the water absorption layer 14 may include an absorbent polymer.

Embodiments of the present disclosure further provide a display apparatus. Referring to FIGS. 1 and 4, the display apparatus includes the above display panel.

Embodiments of the present disclosure further provide a method of manufacturing a moisture conveying layer. Referring to FIGS. 2A, 2B, 2C, 3 and 16, the method includes: a step S101 of forming a bottom wall 131; a step S103 of forming a first sidewall 134 and a second sidewall 134 which are disposed opposite to each other, and which, together with the bottom wall 131, form a moisture conveying channel 130; and a step S105 of forming a flow guide member 133 located between the first sidewall 134 and the second sidewall 134. The flow guide member 133 includes a first end 1331 connected to the bottom wall 131, and a second end 1332, and an angle between the flow guide member 133 and the bottom wall 131 is an acute angle.

Referring to FIGS. 2A, 2B, 2C and 3, in embodiments of the present disclosure, the method further includes: forming a top wall 132 which, together with the first sidewall 134, the second sidewall 134 and the bottom wall 131, forms the moisture conveying channel 130. There is a gap d between the second end 1332 of the flow guide member 133 and the top wall 132.

Embodiments of the present disclosure further provide a method of manufacturing a display panel. Referring to FIGS. 1, 2A, 2B, 2C, 3, 4 and 17, the method includes: a step S201 of providing a display panel substrate 11; a step S203 of forming an organic light-emitting diode 12 on the display panel substrate 11; a step S205 of forming a moisture conveying layer 13 which covers the organic light-emitting diode 12. The moisture conveying layer 13 includes: a bottom wall 131; a first sidewall 134 and a second sidewall 134 which are disposed opposite to each other, and which, together with the bottom wall 131, form a moisture conveying channel 130; and a flow guide member 133 located between the first sidewall 134 and the second sidewall 134. The flow guide member 133 includes a first end 1331 connected to the bottom wall 131, and a second end 1332, and an angle between the flow guide member 133 and the bottom wall 131 is an acute angle.

Embodiments of the present disclosure further provide a display panel. Referring to FIGS. 1 and 4, the display panel includes: a display panel substrate 11; an organic light-emitting diode 12 on the display panel substrate 11; and a moisture conveying layer 13. The moisture conveying layer 13 covers the organic light-emitting diode 12 and is configured to collect a moisture and convey the collected moisture.

Referring to FIGS. 2A, 2B, 2C and 3, in embodiments of the present disclosure. The moisture conveying layer 13 includes: a bottom wall 131; a first sidewall 134 and a second sidewall 134 which are disposed opposite to each other, and which, together with the bottom wall 131, form a moisture conveying channel 130; and a flow guide member 133 located between the first sidewall 134 and the second sidewall 134. The flow guide member 133 includes a first end 1331 connected to the bottom wall 131, and a second end 1332, and an angle between the flow guide member 133 and the bottom wall 131 is an acute angle. The flow guide member 133 may have a rod shape. The flow guide member 133 may have a circular cross section. The second end 1332 of the flow guide member 133 may be a pointed end. For example, the second end 1332 of the flow guide member 133 has an end surface 1334 which extends in a direction substantially perpendicular to the bottom wall 131.

Referring to FIGS. 2A, 2B, 2C and 3, in embodiments of the present disclosure, the moisture conveying layer 13 further includes: a top wall 132 which, together with the first sidewall 134, the second sidewall 134 and the bottom wall 131, forms the moisture conveying channel 130. There is a gap d between the second end 1332 of the flow guide member 133 and the top wall 132.

Referring to FIGS. 2A, 2B, 2C and 3, in embodiments of the present disclosure, the moisture conveying layer 13 further includes: a moisture conveying layer substrate 135 which covers the organic light-emitting diode 12 and on which the bottom wall 131 is located.

Referring to FIGS. 2A, 2B, 2C and 3, in embodiments of the present disclosure, the bottom wall 131 has a hydrophilic surface 1311 configured to be in contact with moisture, and/or each of the first sidewall 134, the second sidewall 134, the top wall 132 and the flow guide member 133 has a hydrophobic surface configured to be in contact with the moisture. Specifically, the first sidewall 134 has a hydrophobic surface 1341 configured to be in contact with the moisture, the second sidewall 134 has a hydrophobic surface 1341 configured to be in contact with the moisture, the top wall 132 has a hydrophobic surface 1321 configured to be in contact with the moisture, and the flow guide member 133 has a hydrophobic surface 1333 configured to be in contact with the moisture.

Referring to FIGS. 2A, 2B, 2C and 3, in embodiments of the present disclosure, the moisture conveying layer 13 further includes: a hydrophilic layer 136 on which the first sidewall 134 and the second sidewall 134 are disposed, and a portion of which constitutes the bottom wall 131.

Referring to FIGS. 2A, 2B, 2C and 3, in embodiments of the present disclosure, the moisture conveying layer 13 includes a plurality of the flow guide members 133 inclined towards a same direction.

Referring to FIG. 3, in embodiments of the present disclosure, an angle between the flow guide member 133 and a normal of the bottom wall 131 ranges from 15 degrees to 75 degrees.

Referring to FIGS. 2A, 2B, 2C and 3, in embodiments of the present disclosure, a spacing W between the top wall 132 and the bottom wall 131 is greater than 2 mm, and less than or equal to 5 mm, a maximal size of the flow guide member 133 in a direction from the first sidewall 134 to the second sidewall 134 is in a range of 0.2 mm to 0.8 mm, and the gap d between the second end 1332 of the flow guide member 133 and the top wall 132 is greater than 0.25 mm, and less than or equal to 0.6 mm.

Referring to FIGS. 2A, 2B, 2C and 3, in embodiments of the present disclosure, the display panel further includes: a water absorption layer 14 located at an end of the moisture conveying channel 130 of the moisture conveying layer 13. The moisture conveying layer 13 is configured to convey the collected moisture to the water absorption layer 14 and the water absorption layer 14 is configured to absorb the moisture. Referring to FIGS. 1 to 4, the display panel includes two water absorption layers 14 respectively located at two ends of the moisture conveying channel 130 of the moisture conveying layer 13. A material of the water absorption layer 14 may include an absorbent polymer.

Referring to FIGS. 2A, 2B, 2C and 3, in embodiments of the present disclosure, a material of the bottom wall 131 includes any one or any combination(s) of titanium dioxide, copper oxide, silicon dioxide, and aluminum oxide. For example, a material of the hydrophilic layer 136 includes any one or any combination(s) of titanium dioxide, copper oxide, silicon dioxide, and aluminum oxide.

FIG. 1 shows a display panel according to an embodiment of the present disclosure. The display panel includes: a display panel substrate 11, an organic light-emitting diode 12, a moisture conveying layer 13, and a water absorption layer 14.

As shown in FIG. 1, the organic light-emitting diode 12 is located on the display panel substrate 11, the moisture conveying layer 13 covers the organic light-emitting diode 12, the water absorption layer 14 is located on a side of the moisture conveying layer 13 facing away from the organic light-emitting diode 12, the moisture conveying layer 13 is configured to collect a moisture and convey the collected moisture to the water absorption layer 14, and the water absorption layer 14 is configured to absorb the moisture.

In the present embodiment, the moisture conveying layer is disposed on the organic light-emitting diode to collect a moisture and convey the collected moisture to the water absorption layer, thereby reducing an amount of moisture entering the organic light-emitting diode and thus prolonging a service life of the organic light-emitting diode.

In an embodiment, as shown in FIGS. 2(A) to 3, the moisture conveying layer 13 may include: a moisture conveying layer substrate 135, a hydrophilic layer 136, sidewalls 134, a top wall 132, a bottom wall 131 constituted by a portion of the hydrophilic layer 136, and a flow guide member 133. The sidewalls 134, the top wall 132, the bottom wall 131, and the flow guide member 133 constitute a drain passage such as a unidirectional drain passage. The moisture conveying layer substrate 135 covers the organic light-emitting diode 12. The hydrophilic layer 136 is located on the moisture conveying layer substrate 135. The sidewalls 134 and the flow guide member 133 are located on the hydrophilic layer 136.

As shown in FIGS. 2(A) to 3, the sidewalls 134 include a first sidewall 134 and a second sidewall 134 disposed opposite to each other. The flow guide member 133 is located between the first sidewall 134 and the second sidewall 134 and between the top wall 132 and the bottom wall 131. A first end 1331 of the flow guide member 133 is in contact with the bottom wall 131, and there is a gap between a second end 1332 of the flow guide member 133 and the top wall 132. The flow guide member 133 extends from the first end 1331 to the second end 1332. A first angle β between an extension direction of the flow guide member 133 and the bottom wall 131 is an acute angle. In an embodiment, there may be a plurality of flow guide members 133 parallel to one another between the first sidewall 134 and the second sidewall 134.

In an embodiment, the first sidewall 134 and the second sidewall 134 may be disposed along edges of the hydrophilic layer 136, respectively, thereby avoiding an existence of the hydrophilic layer outside the first sidewall 134 and the second sidewall 134. As a result, there is no water drop condensed on the hydrophilic layer which cannot be drained by the drain passage to the water absorption layer 14 to affect the organic light-emitting diode.

In an embodiment, the hydrophilic layer 136 may be disposed on an entire side surface of the moisture conveying layer substrate 135 facing away from the organic light-emitting diode 12 and the first sidewall 134 and the second sidewall 134 may be disposed along edges of the moisture conveying layer substrate 135, respectively. In this way, moisture surrounding the organic light-emitting diode 12 may be condensed by means of an entire side surface, facing away from the organic light-emitting diode 12, of the hydrophilic layer 136 on the moisture conveying layer substrate 135, and is conveyed by the drain passage to the water absorption layer 14, thereby further reducing an amount of moisture entering the organic light-emitting diode and thus prolonging service life of the organic light-emitting diode.

Figure 5:
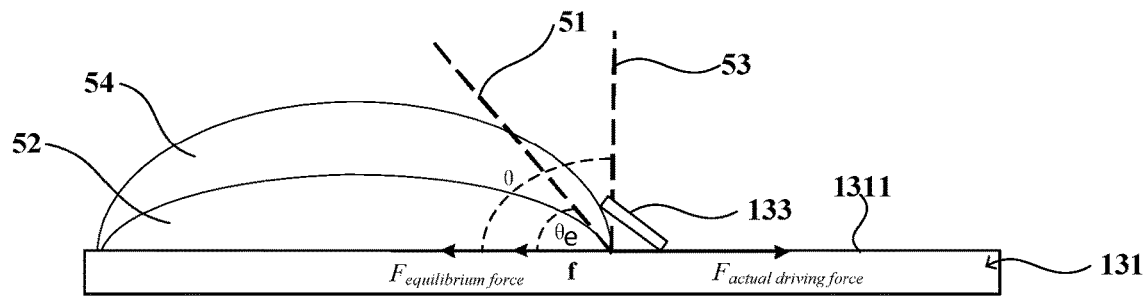
FIG. 5 is a schematic diagram showing forces received by a liquid drop in the drain passage according to an embodiment of the present disclosure.

In an embodiment, as shown in FIGS. 3 and 5, each of the first sidewall 134 and the second sidewall 134 may have a rectangular shape. The rectangular sidewall 134 has a long side in contact with the bottom wall 131. The first end 1331 of the flow guide member 133 may be in contact with a surface 1311 of the bottom wall 131 facing towards the top wall 132. An angle between the extension direction of the flow guide member 133 and a normal direction of the surface 1311 is a second angle α. Referring to FIG. 3, the flow guide member 133 may have a plate shape, or may have a rectangular cross section, a circular cross section, or the like. For example, the flow guide member 133 may have the rectangular cross section, and two inclined end surfaces. The flow guide member 133 includes a first surface B1, a second surface B2, and a third surface B3. The flow guide member 133 is bounded by the first surface B1, the second surface B2, the third surface B3 and the surface 1311. The first surface B1 extends in the extension direction, and the second surface B2 adjoins the first surface B1 and extends in a direction perpendicular to the surface 1311. The third surface B3 adjoins the second surface B2 and is parallel to the first surface B1. An angle between the first surface B1 and the second surface B2 is equal to the second angle α. The second angle may also be referred to as the angle of inclination of the flow guide member 133. An angle between the first surface B1 and the surface 1311 is the first angle ft.

In an embodiment, a thickness of each of the first sidewall 134 and the second sidewall 134 is greater than a width of each of the first surface B1, the second surface B2, and the third surface B3.

In an embodiment, the thickness or a diameter of the first sidewall 134 is in a range of 0.2 mm to 0.8 mm. The thickness or a diameter of the second sidewall 134 is in a range of 0.2 mm to 0.8 mm. The thickness or a diameter of the flow guide member 133 is in a range of 0.2 mm to 0.8 mm. The width of the first surface is in a range of 0.2 mm to 0.8 mm. The width of the second surface is in a range of 0.2 mm to 0.8 mm. The width of the third surface is in a range of 0.2 mm to 0.8 mm.

In an embodiment, the thickness of the first sidewall 134 may be much less than its length. Thus, the first sidewall 134 has a shape approaching a line segment. Likewise, the thickness of the second sidewall 134 may be much less than its length. Thus, the second sidewall 134 has a shape approaching a line segment. The line-segment-shaped sidewalls 134 may be plotted by a hydrophobic ink. For example, the line-segment-shaped sidewalls 134 each have a thickness of 0.2 mm. In other words, each of the first sidewall 134, the second sidewall 134, and the flow guide member 133 may have a thickness of 0.2 mm and may have a shape approaching a line segment.

In an embodiment, the second angle α ranges from 15 degrees to 75 degrees.

In an embodiment, a spacing d between the flow guide member 133 and the top wall 132 is greater than 0.25 mm, and less than or equal to 0.6 mm. The spacing d between the flow guide member 133 and the top wall 132 is also referred to as a gap size. In an embodiment, in a manufacturing process, the gap size d may have, for example, a minimal tolerance of 0.1 mm.

In an embodiment, a spacing W between the bottom wall 131 and the top wall 132 is greater than 2 mm, and less than or equal to 5 mm. The spacing between the bottom wall 131 and the top wall 132 may also be referred to as a channel depth.

In some embodiments, the second angle α is 60 degrees, the spacing W between the bottom wall 131 and the top wall 132 is 5 mm, and the spacing d between the flow guide member 133 and the top wall 132 is 0.6 mm.

In an embodiment, a material of the hydrophilic layer includes any one or any combination(s) of titanium dioxide ($TiO_2$), copper oxide (CuO), silicon dioxide ($SiO_2$), and aluminum oxide ($Al_2O_3$). In some embodiments, the material of the hydrophilic layer includes titanium dioxide. Specifically, the hydrophilic layer may be manufactured by applying titanium dioxide ($TiO_2$) particles to the moisture conveying layer substrate 135. Since the titanium dioxide ($TiO_2$) particles have a photocatalysis, an endurance life of the hydrophilic layer can be guaranteed.

In an embodiment, a material of the water absorption layer may include an absorbent polymer. In an exemplary embodiment, the material of the water absorption layer may include a super absorbent polymer. The super absorbent polymer is insoluble in water and organic solvents, and generally its water absorption capacity can reach 500-2000 times and up to 5000 times its own weight. The super absorbent polymer swells as a hydrogel after absorbing water. The super absorbent polymer has an excellent water retentiveness. Even if the super absorbent polymer is pressed, the water is not easily squeezed out. After the absorbent polymer that has absorbed water is dried, its water absorption capacity can be restored.

In an embodiment, as shown in FIG. 4, the display panel substrate 11 may include a center region C and an edge region E surrounding the center region. The organic light-emitting diode 12 may be located in the center region C and the water absorption layer 14 may be located in the edge region E. In this way, the collected moisture is conveyed to the water absorption layer located in the edge region of the organic light-emitting diode, reducing an influence of the water absorption layer on a display property of the display panel.

In an embodiment, as shown in FIGS. 1 and 4, the display panel may further include a packaging layer 15. The packaging layer 15 is located on an outer side of the water absorption layer 14. In an embodiment, the packaging layer 15 may include a packaging cover plate which may be a metal cover plate or a glass cover plate. The packaging cover plate may be fixed to the display panel substrate 11 through a sealing adhesive layer 16. A material of the sealing adhesive layer 16 may be an absorbent polymer. In another embodiment, the packaging layer 15 may also be a packaging film. The packaging film may be, for example, an inorganic film, an inorganic-inorganic hybrid film, a silicon nitride film, an organic film, an organic-organic hybrid film, an organic-inorganic hybrid film, or the like.

In an embodiment, the display panel substrate 11 may be a rigid substrate such as a glass substrate, or a flexible substrate.

In an embodiment, a material of the moisture conveying layer substrate 135 may be polymethyl methacrylate (PMMA), commonly known as an organic glass, but is not limited to this.

In an embodiment, the organic light-emitting diode 12 may include an anode 121, a hole transport layer 122, a light emitting layer 123, an electron transport layer 124, and a cathode 125. In another embodiment, the organic light-emitting diode 12 may further include a cathode buffer layer 126 configured to protect the cathode 125. The moisture conveying layer 13 may cover the cathode buffer layer 126.

In an embodiment, as shown in FIGS. 1 and 4, the moisture conveying layer 13 may cover the organic light-emitting diode 12. The number of the water absorption layer 14 may be two. Two water absorption layers 14 may be located at two ends of the moisture conveying layer 13, respectively. A packaged organic light-emitting diode is obtained by packaging the organic light-emitting diode 12, the moisture conveying layer 13, and the water absorption layer 14 with the packaging layer 15. The moisture conveying layer 13 may include a first drain passage, a second drain passage, and a third drain passage. The first drain passage is in contact with one of the two water absorption layers 14. The second drain passage is connected with the third drain passage, and the third drain passage is in contact with the other of the two water absorption layers 14. There are a plurality of flow guide members 133 arranged directionally in each of the drain passages. Referring to FIG. 4, the first drain passage is configured to directionally convey collected water drops in a first direction D1 until the collected water drops reach the corresponding water absorption layer 14. The second drain passage is configured to directionally convey collected water drops to the third drain passage in a second direction D2. The third drain passage is configured to directionally convey collected water drops in a third direction D3 until the collected water drops reach the corresponding water absorption layer 14.

In the embodiments of the present disclosure, a specific principle in which the plurality of flow guide members 133 arranged directionally can directionally convey collected water drops is that the inclined flow guide members 133 arranged directionally can generate unbalanced resistances to the liquid, thereby driving the liquid to be conveyed unidirectionally. The liquid is unidirectionally conveyed by different resistances to the liquid in advancing and receding directions. During a collection of the liquid, a small advancing angle means a relatively low resistance to a diffusion of the liquid. In order to reduce an additional resistance of the moisture conveying layer substrate 135 to a movement of the liquid, a hydrophilicity of a surface of the moisture conveying layer substrate 135 can be increased by applying the titanium dioxide ($TiO_2$) particles to the surface, so that the additional resistance of the moisture conveying layer substrate 135 to the movement of the liquid is minimized. A unidirectional conveying capacity of the moisture conveying channel relates to the depth W of the moisture conveying channel, the angle of inclination α of the flow guide member 133, and the gap size d.

A resistance f per unit length to a movement of a liquid drop on a plane may be given by the following formula (1):

$$f=\gamma(\cos\theta-\cos\theta e) \tag{1}$$

where f is the resistance per unit length to the movement of the liquid drop (N/m), γ is a surface tension, and θ is an actual contact angle, θe is an equilibrium contact angle, a contact line 51 is a contact line of an equilibrium liquid 52, a contact line 53 is a contact line of the equilibrium liquid 52 to which a liquid 54 has been added, $F_{equilibrium\ force}$ is an interfacial tension acting on a contact face of the equilibrium liquid 52 where the equilibrium liquid 52 is in contact with the bottom wall 131, and $F_{actual\ driving\ force}$ is a force acting on the contact face to diffuse the liquid, and is equal to $F_{diffusion}$, as shown in FIG. 5. Assuming that l is a length of the flow guide member 133 (referring to FIG. 3), dt is a diameter or a thickness of the flow guide member 133 (referring to FIG. 3), ls is a length of a contact line facing a diffusion direction, lt is a length of a contact line, a relation between a total resistance $F_{total}$ to a movement of the liquid and the contact line and flow guide member 133 may be given by the following formula (2):

$$F_{total}=f*lt \tag{2}$$

The length lt of the contact line facing the diffusion direction is equal to the length ls of the contact line facing the diffusion direction. The length ls of the contact line facing the diffusion direction may be calculated by the following formula (3):

$$ls=dt/\sin\alpha \tag{3}$$

Let the length lt of the contact line in the formula (2) be equal to the length ls of the contact line facing the diffusion direction. The following formula (4) is obtained by substituting the formulas (1) and (3) into the formula (2):

$$F_{diffusion}=\gamma*(\cos\theta-\cos\theta e)*dt/\sin\alpha \tag{4}$$

The length lt of the contact line facing a resistance direction is equal to a length of a contact line facing the resistance direction, and may be calculated by the following formula (5):

$$lt=(W-d)/\cos\alpha \tag{5}$$

A force $F_{resistance}$ acting on the liquid in the resistance direction may be given by the following formula (6) derived from the formula (2):

$$F_{resistance}=\gamma*(\cos\theta-\cos\theta e)*\cos\alpha*lt \tag{6}$$

The following formula (7) is obtained by substituting the formula (5) into the formula (6):

$$F_{resistance}=\gamma*(W-d)*(\cos\theta-\cos\theta e) \tag{7}$$

Figure 6:
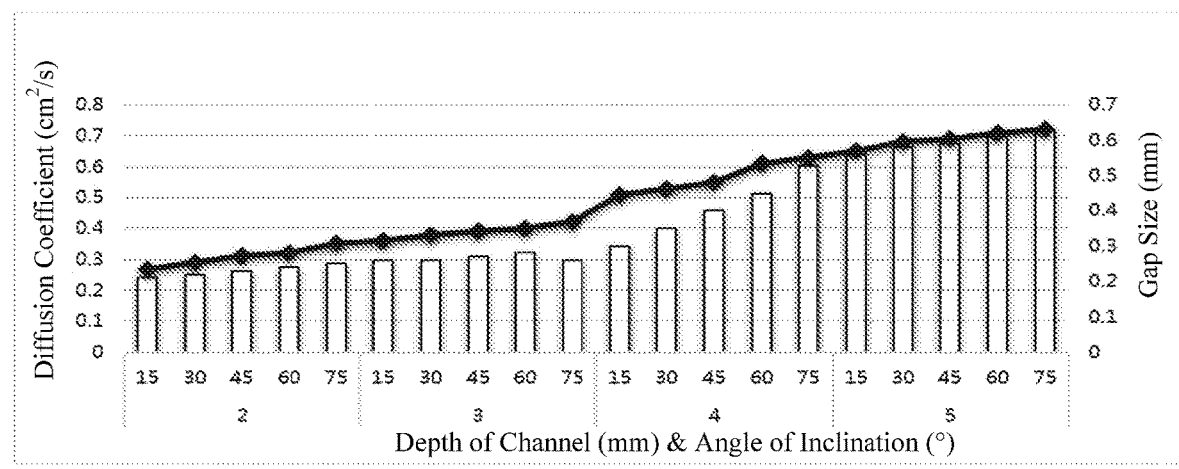
FIG. 6 is a schematic diagram showing a relation between a diffusion of the liquid drop and a depth of a channel, an angle of inclination of the flow guide member, and a size of a gap, according to an embodiment of the present disclosure.

As shown in FIG. 6, a unidirectional water conveying capacity of the drain passage is gradually increased in the case where the depth W of the channel is equal to 4 mm, the gap size d is increased from 0.35 mm to 0.5 mm, and the angle of inclination α is increased from 15 degrees to 75 degrees. FIG. 6 shows that a larger angle of inclination α is a primary condition for a unidirectional diffusion of the liquid. In FIG. 6, a physical quantity represented by the first row of the axis of abscissas is the angle of inclination (degrees "°"), a physical quantity represented by the second row of the axis of abscissas is the depth W of the channel (mm), a physical quantity represented by the left axis of ordinates is a diffusion coefficient ($cm^2$/s) indicated by the curve, and a physical quantity represented by the right axis of ordinates is the gap size (mm) indicated by heights of rectangles.

Figure 7:
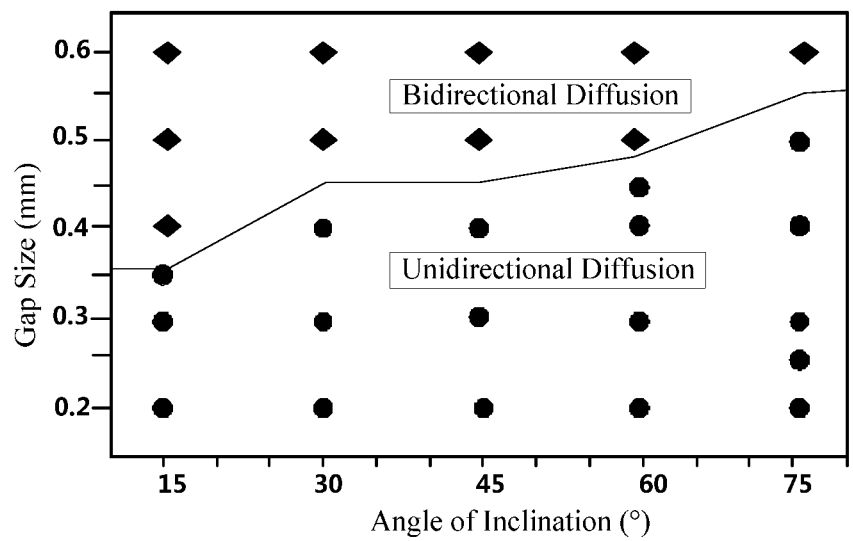
FIG. 7 is a schematic diagram showing a relation between the diffusion of the liquid drop and the angle of inclination of the flow guide member and the size of the gap, according to an embodiment of the present disclosure.
Figure 8:
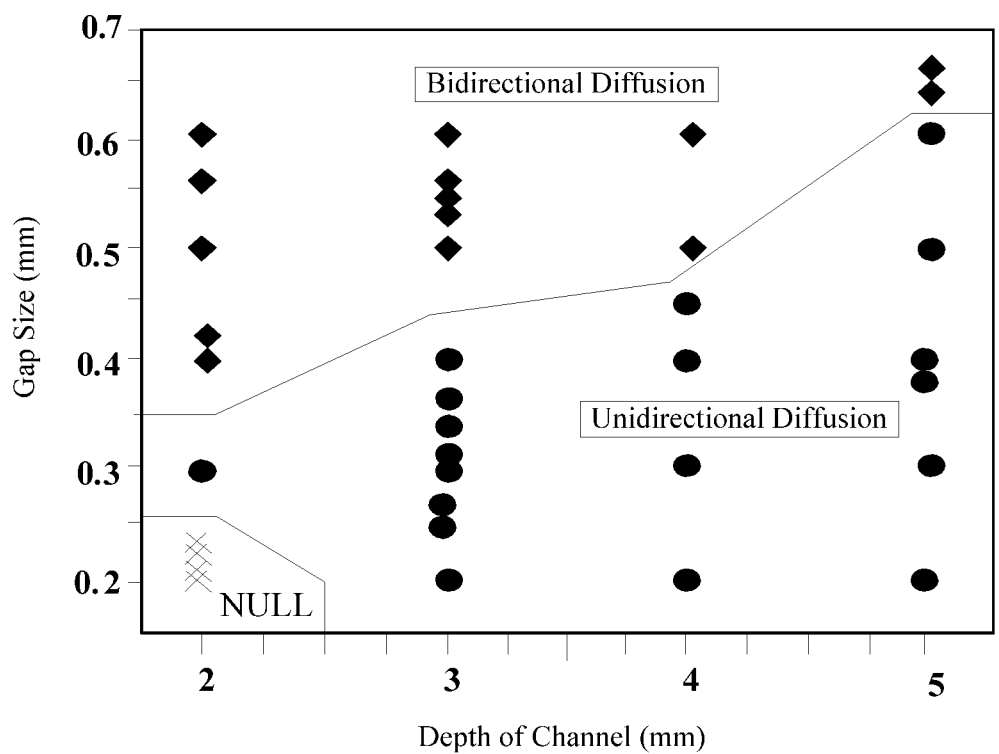
FIG. 8 is a schematic diagram showing a relation between the diffusion of the liquid drop and the depth of the channel and the size of the gap, according to an embodiment of the present disclosure.
Figure 9:
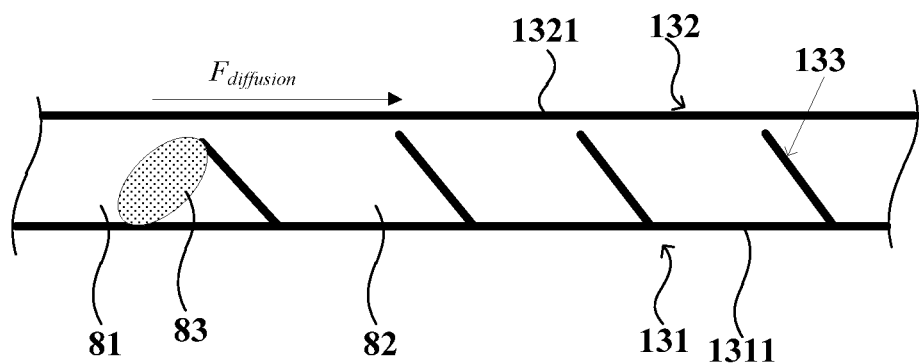
FIG. 9 is a schematic diagram showing a diffusion of the liquid drop according to an embodiment of the present disclosure, in which the liquid drop is located in a first unit on an upstream side of a flow guide member in a movement direction of the liquid drop.
Figure 10:
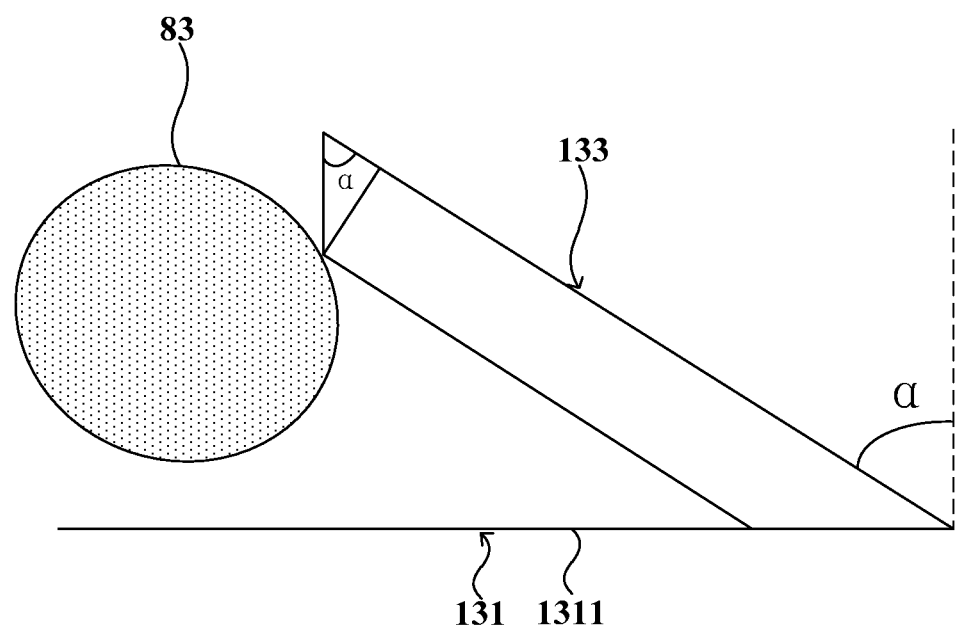
FIG. 10 is a schematic enlarged diagram showing the diffusion of the liquid drop according to the embodiment of the present disclosure, shown in FIG. 9.
Figure 11:
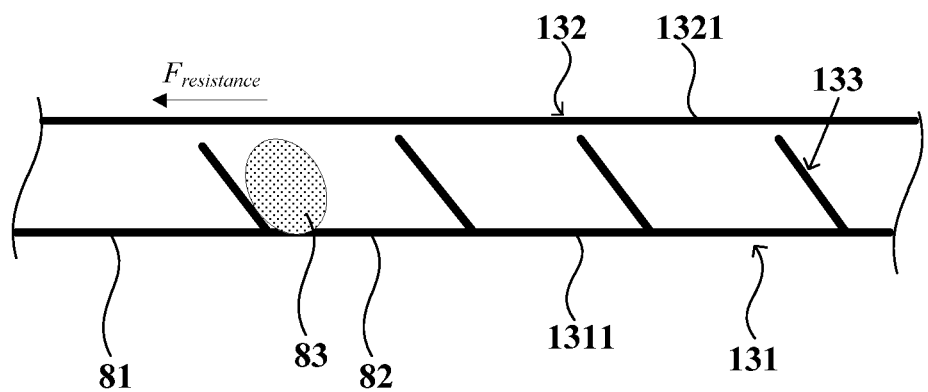
FIG. 11 is a schematic diagram showing the diffusion of the liquid drop according to the embodiment of the present disclosure, in which the liquid drop is located in a second unit on a downstream side of the flow guide member in the movement direction of the liquid drop.
Figure 12:
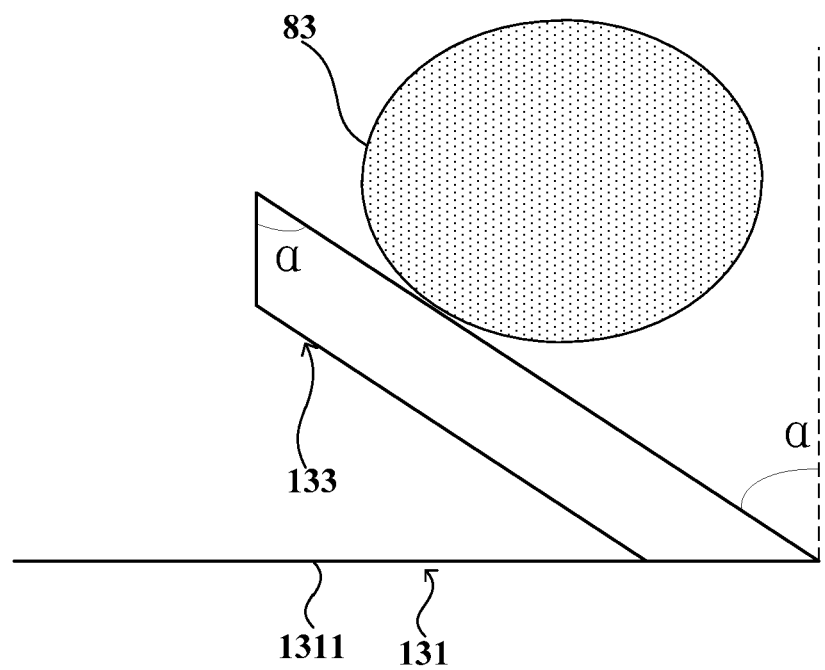
FIG. 12 is a schematic enlarged diagram showing the diffusion of the liquid drop according to the embodiment of the present disclosure, shown in FIG. 11.
Figure 13:
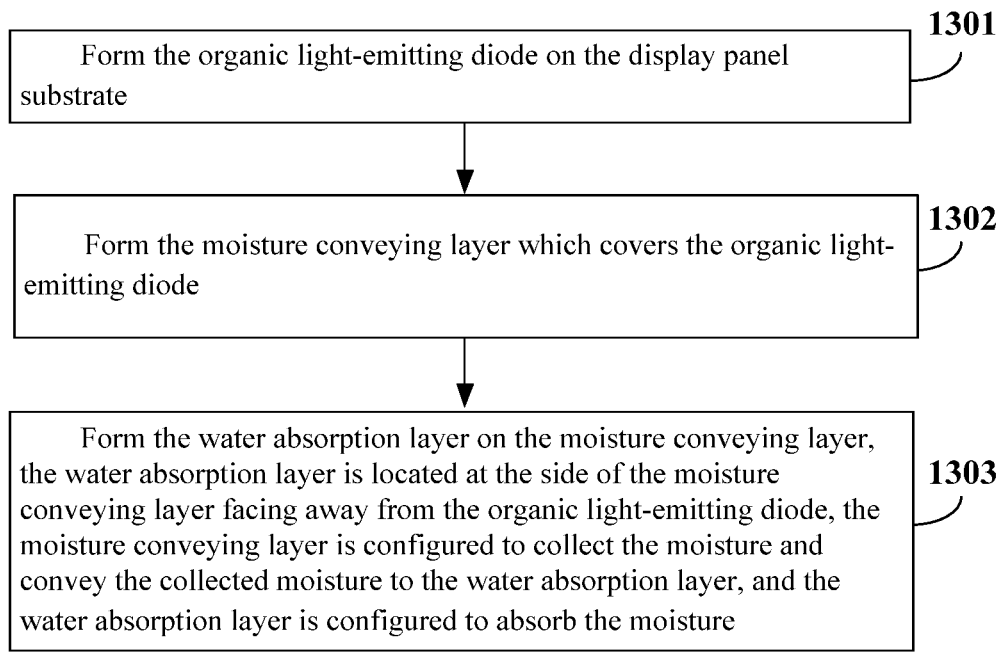
FIG. 13 is a flow diagram showing a method of manufacturing a display panel according to an embodiment of the present disclosure.
Figure 14:
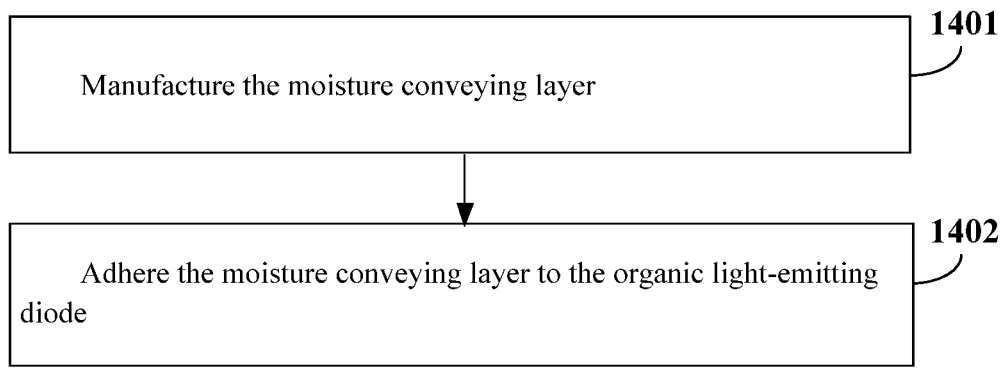
FIG. 14 is a flow diagram showing a method of manufacturing a display panel according to another embodiment of the present disclosure.
Figure 15:
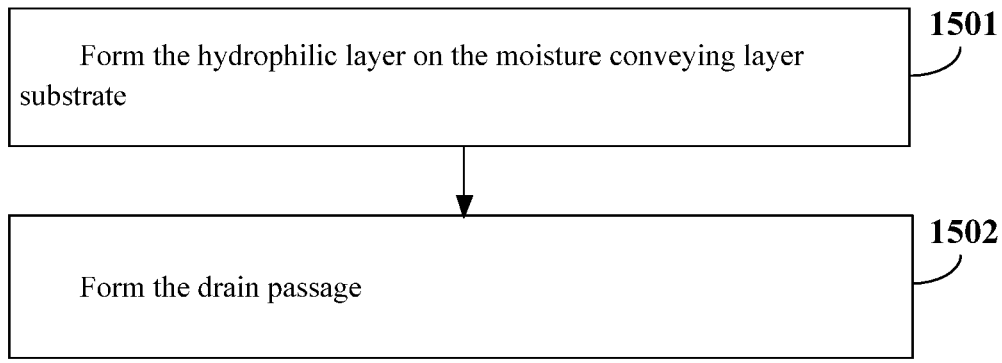
FIG. 15 is a flow diagram showing a method of manufacturing a display panel according to still another embodiment of the present disclosure.
Figure 16:
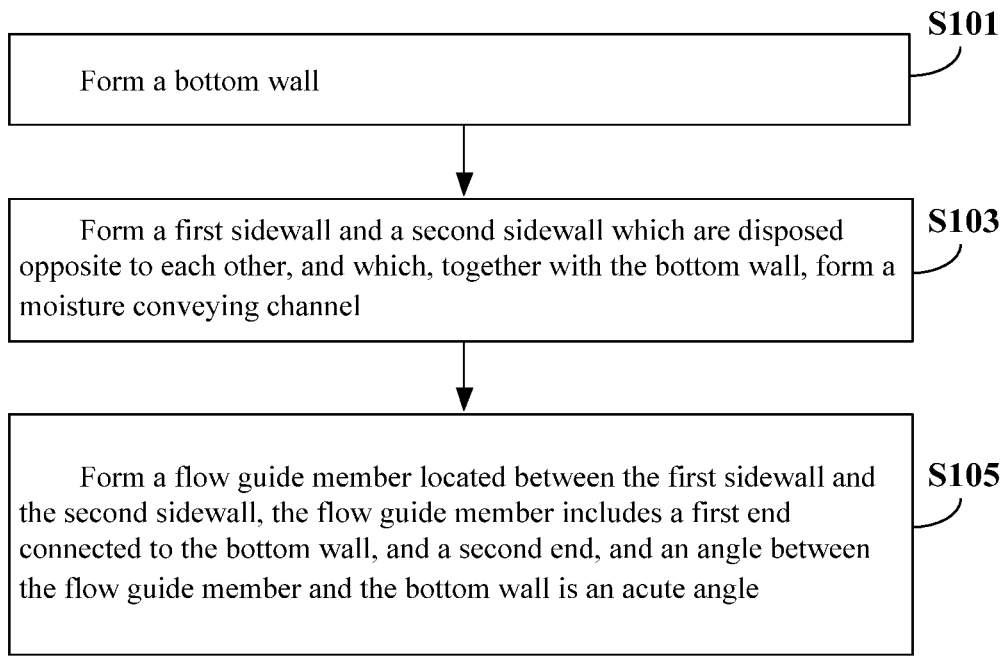
FIG. 16 is a flow diagram showing a method of manufacturing a moisture conveying layer according to an embodiment of the present disclosure.
Figure 17:
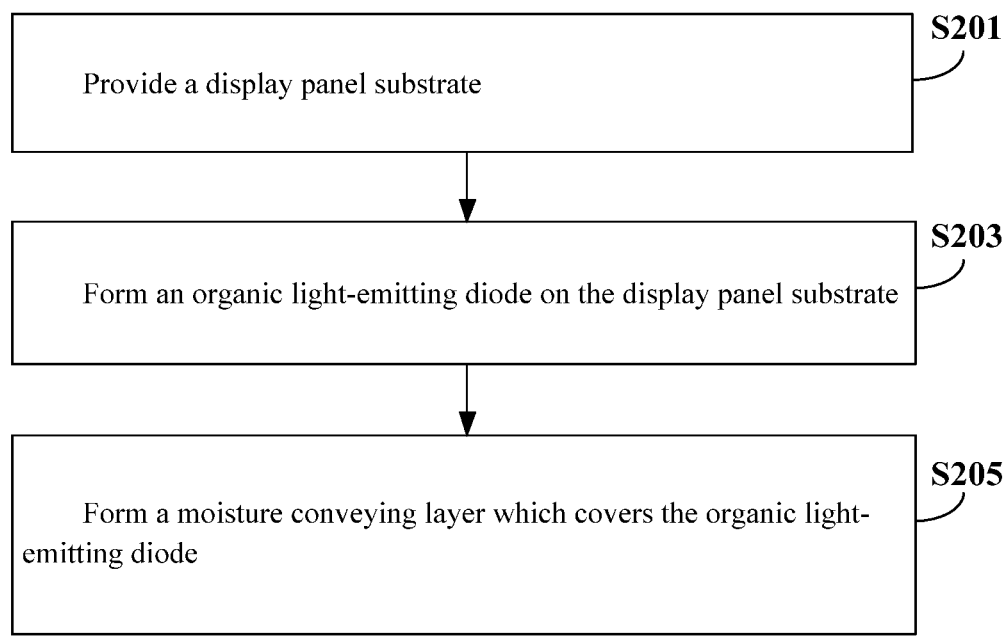
FIG. 17 is a flow diagram showing a method of manufacturing a display panel according to an embodiment of the present disclosure.

As shown in FIGS. 6-8, a unidirectional diffusion capability of the liquid is maximum in the case where the angle of inclination is 60°, the depth of the channel is 5 mm, and the gap size is 0.6 mm. In FIGS. 7 and 8, the circles represent data in a unidirectional diffusion, and the quadrangles represent data in a bidirectional diffusion.

As shown in FIG. 8, in the case where the depth of the channel is 2 mm, and the gap size is only 0.3 mm, a resistance is excessively large and a total critical gap size is small so that the liquid is not allowed to flow. The NULL in FIG. 8 represents a null data set. As shown in FIGS. 7-8, there are two main factors affecting a directionally conveying rate of the liquid. One of the two main factors is the angle of inclination α of the flow guide member 133, and the other is the depth of the channel. A unidirectional conveying rate of the liquid can be increased by increasing the depth of the channel and the angle of inclination α of the flow guide member 133.

FIGS. 9-12 show a case in which a water drop 83 diffuses from an upstream side (i.e. a first side) of the flow guide member 133 in a movement direction of the water drop towards a downstream side (i.e. a second side) of the flow guide member 133 in the movement direction of the water drop. The water drop 83 continually increases in a first unit 81 between two flow guide members 133 due to a collection of water. A leading edge of the water drop 83 always retains an arc shape until the water drop 83 diffuses forwards from the first unit 81 towards a second unit 82. When the water drop 83 diffuses forwards, the flow guide member 133 easily pierces a surface of the water drop 83. Once the water drop 83 comes into contact with the surface 1311 (which may be, for example, a hydrophilic surface or a super hydrophilic surface) of the bottom wall 131, it will move forwards quickly. In comparison, the water drop 83 difficulty flows in an opposite direction (for example from the second unit 82 towards the first unit 81). In this case, a driving force acting on the water drop mainly depends on a free diffusion on the surface 1311 (which may be, for example, a hydrophilic surface or a super hydrophilic surface) of the bottom wall 131. For example, the driving force acting on the water drop mainly depends on a free diffusion on a hydrophilic interface or a super hydrophilic interface. In the present embodiment, a unit is formed between two adjacent flow guide members 133.

In the embodiments of the present disclosure, the drain passage can directionally convey water which is injected into the drain passage at a flow rate of 300 ml/h. The flow guide members 133 of the drain passage are inclined in the same direction. Water always diffuses unidirectionally along the drain passage regardless of where the water is injected. The titanium dioxide ($TiO_2$) particles added to the drain passage have a photocatalysis, so that an endurance life of the hydrophilic layer 136 on the moisture conveying layer substrate 135 can be guaranteed. Therefore, the drain passage with such a structure may repeatedly unidirectionally convey water, for example at least 10 times. In the case where the material of the moisture conveying layer substrate 135 is polymethyl methacrylate (PMMA), the liquid may be hindered by an excessively large resistance of a surface of the PMMA substrate from being conveyed for a long distance to be collected at one or more flow guide members 133, if no titanium dioxide ($TiO_2$) is applied to the moisture conveying layer substrate.

Embodiments of the present disclosure further provide a display apparatus including a display module, and the display panel according to any one of the above embodiments.

In the present embodiment, the moisture conveying layer is disposed on the organic light-emitting diode to collect a moisture and convey the collected moisture to the water absorption layer, thereby reducing an amount of moisture entering the organic light-emitting diode and thus prolonging a service life of the organic light-emitting diode.

Embodiments of the present disclosure further provide a method of manufacturing the above display panel. The method includes the following steps 1301-1303.

In the step 1301, the organic light-emitting diode is formed on the display panel substrate.

In the step 1302, the moisture conveying layer which covers the organic light-emitting diode is formed.

In the step 1303, the water absorption layer is formed on the moisture conveying layer. The water absorption layer is located at the side of the moisture conveying layer facing away from the organic light-emitting diode, the moisture conveying layer is configured to collect the moisture and convey the collected moisture to the water absorption layer, and the water absorption layer is configured to absorb the moisture.

In the present embodiment, the moisture conveying layer is disposed on the organic light-emitting diode to collect a moisture and convey the collected moisture to the water absorption layer, thereby reducing an amount of moisture entering the organic light-emitting diode and thus prolonging a service life of the organic light-emitting diode.

In an embodiment, the step 1302 includes the following steps 1401-1402.

In the step 1401, the moisture conveying layer is manufactured.

In the step 1402, the moisture conveying layer is adhered to the organic light-emitting diode.

In an embodiment, the step 1401 includes the following steps 1501-1502.

In the step 1501, the hydrophilic layer is formed on the moisture conveying layer substrate 135.

In the step 1502, the drain passage is formed.

In an embodiment, the material of the hydrophilic layer includes titanium dioxide.

According to the embodiments of the present disclosure, the process of manufacturing the moisture conveying layer is simple and convenient, and has a low cost. The service life of the moisture conveying layer is long.

It is to be noted that the display apparatus according to the embodiments of the present disclosure may include any products or parts having a display function such as an electronic paper, a mobile phone, a tablet computer, a television, a display, a notebook computer, a digital frame, and a navigator.

In the embodiments, forming processes in the above manufacturing methods may include, for example, a film forming process such as depositing and sputtering, and a patterning process such as etching.

It should be noted that in the drawings, sizes of layers and regions may be exaggerated for the purpose of clarity of illustrations. Furthermore, it can be understood that when an element or a layer is referred to as being "on" another element or layer, the former may be directly on the latter, or there may be an intermediate element or layer between them. In addition, it can be understood that when an element or a layer is referred to as being "under" another element or layer, the former may be directly under the latter, or there may be at least one intermediate element or layer between them. Further, it can be understood that when an element or a layer is referred to as being "between" two elements or layers, it may be a unique one between the two elements or layers, or there may be at least one additional intermediate element or layer. Like reference numerals refer to like elements in the description throughout.

In the embodiment of the present disclosure, the terms "first" and "second" are used for only descriptive purposes and should not to be construed as indicating or implying a relative importance. The term "plurality of" means two or more unless otherwise explicitly defined.

Although some exemplary embodiments of the present disclosure have been shown and described above, it would be appreciated by a person skilled in the art that many modifications or changes may be made therein without departing from the principle and spirit of the present disclosure, the scope of which is defined in the appended claims and their equivalents.

What is claimed is:

1. A moisture conveying layer comprising:
a bottom wall;
a first sidewall and a second sidewall which are disposed opposite to each other, and which, together with the bottom wall, form a moisture conveying channel; and
a flow guide member located between the first sidewall and the second sidewall, wherein the flow guide member comprises a first end connected to the bottom wall, and a second end, and an angle between the flow guide member and the bottom wall is an acute angle.

2. The moisture conveying layer of claim 1, further comprising:
a top wall which, together with the first sidewall, the second sidewall and the bottom wall, forms the moisture conveying channel, wherein there is a gap between the second end of the flow guide member and the top wall.

3. The moisture conveying layer of claim 2, wherein:
the bottom wall has a hydrophilic surface configured to be in contact with moisture.

4. The moisture conveying layer of claim 3, further comprising:
a hydrophilic layer, on which the first sidewall and the second sidewall are disposed, and a portion of which constitutes the bottom wall.

5. The moisture conveying layer of claim 2, wherein each of the first sidewall, the second sidewall, the top wall and the flow guide member has a hydrophobic surface configured to be in contact with the moisture.

6. The moisture conveying layer of claim 2, wherein:
a spacing between the top wall and the bottom wall is greater than 2 mm, and less than or equal to 5 mm,
a maximal size of the flow guide member in a direction from the first sidewall to the second sidewall is in a range of 0.2 mm to 0.8 mm, and
the gap between the second end of the flow guide member and the top wall is greater than 0.25 mm, and less than or equal to 0.6 mm.

7. The moisture conveying layer of claim 1, further comprising:
a moisture conveying layer substrate on which the bottom wall is located.

8. The moisture conveying layer of claim 1, wherein:
the flow guide member has a rod shape.

9. The moisture conveying layer of claim 1, wherein:
there is a gap between the flow guide member and at least one of the first sidewall and the second sidewall.

10. The moisture conveying layer of claim 1, wherein:
the second end of the flow guide member is a pointed end includes at least one of: a pointed end; and an end surface which extends in a direction substantially perpendicular to the bottom wall.

11. The moisture conveying layer of claim 1, wherein:
the moisture conveying layer comprises a plurality of the flow guide members inclined towards a same direction.

12. The moisture conveying layer of claim 1, wherein:
an angle between the flow guide member and a normal of the bottom wall ranges from 15 degrees to 75 degrees.

13. The moisture conveying layer of claim 1, wherein:
a material of the bottom wall comprises any one or any combination of titanium dioxide, copper oxide, silicon dioxide, and aluminum oxide.

14. A display panel comprising:
an organic light-emitting diode; and
the moisture conveying layer of claim 1, wherein the moisture conveying layer covers the organic light-emitting diode, and is configured to collect moisture and convey the collected moisture.

15. The display panel of claim 14, further comprising:
a water absorption layer located at an end of the moisture conveying channel of the moisture conveying layer, wherein the moisture conveying layer is configured to convey the collected moisture to the water absorption layer and the water absorption layer is configured to absorb the moisture.

16. The display panel of claim 15, wherein:
a material of the water absorption layer comprises an absorbent polymer.

17. A display apparatus comprising the display panel of claim 14.

18. A method of manufacturing the display panel of claim 14, the method comprising:
providing a display panel substrate;
forming the organic light-emitting diode on the display panel substrate; and
forming the moisture conveying layer.

19. A method of manufacturing the moisture conveying layer of claim 1, the method comprising:
forming the bottom wall;
forming the first sidewall and the second sidewall; and
forming the flow guide member located between the first sidewall and the second sidewall.

20. The method of claim 19, further comprising:
forming a top wall which, together with the first sidewall, the second sidewall and the bottom wall, forms the moisture conveying channel, wherein there is a gap between the second end of the flow guide member and the top wall.

* * * * *